United States Patent

McFadden

[11] 4,050,814
[45] Sept. 27, 1977

[54] PROGRAMMABLE LIGHT CONTROL MATRIX DEVICE

[75] Inventor: Thomas A. McFadden, Mountain View, Calif.

[73] Assignee: Rockwell International Corporation, El Segundo, Calif.

[21] Appl. No.: 536,136

[22] Filed: Dec. 24, 1974

[51] Int. Cl.² .................................................. G03B 27/72
[52] U.S. Cl. ...................................... 355/71; 350/160 R; 350/160 LC; 354/227
[58] Field of Search ................. 350/160 LC, 160 R; 355/71; 354/227

[56] References Cited

U.S. PATENT DOCUMENTS

| 3,164,665 | 1/1965 | Stello | 354/227 X |
| 3,440,620 | 4/1969 | French | 350/160 LC |
| 3,476,029 | 11/1969 | Schreckengust | 354/227 |
| 3,703,331 | 11/1972 | Goldmacher | 350/160 LC |
| 3,741,629 | 6/1963 | Kahn | 350/160 LC |
| 3,781,088 | 12/1973 | Tsukomoto | 350/160 LC |
| 3,787,834 | 1/1974 | Elliott | 350/160 LC X |
| 3,837,730 | 9/1974 | Hatfield et al. | 350/160 LC |
| 3,846,015 | 11/1974 | Mor | 350/160 LC |
| 3,848,965 | 11/1974 | Adams, Jr. et al. | 350/160 LC |
| 3,854,751 | 12/1974 | Haas et al. | 350/160 LC |
| 3,938,134 | 2/1976 | Hackstein et al. | 350/160 LC X |
| 3,955,208 | 5/1976 | Wick et al. | 354/227 |
| 3,956,745 | 5/1976 | Ellis | 350/160 LC |

*Primary Examiner*—Edna M. O'Connor
*Attorney, Agent, or Firm*—Howard R. Greenberg; H. Fredrick Hamann

[57] ABSTRACT

A light control matrix device employs a planar matrix array of individually electrically energizable cells containing an electrooptic material for controlling the light pattern which is transmitted therethrough.

12 Claims, 6 Drawing Figures

| | 1 | 2 | 3 | 4 | 5 | 6 | 7 | 8 | 9 | 10 | ← COLUMN NO. |
|---|---|---|---|---|---|---|---|---|---|---|---|
| 1 | $S_1$ | $S_2$ | $S_1$ | $S_2$ | $S_1$ | $S_2$ | $S_1$ | $S_2$ | $S_1$ | $S_2$ | |
| 2 | $S_3$ | $S_4$ | $S_3$ | $S_4$ | $S_3$ | $S_4$ | $S_3$ | $S_4$ | $S_3$ | $S_4$ | |
| 3 | $S_1$ | $S_2$ | $S_1$ | $S_2$ | $S_1$ | $S_2$ | $S_1$ | $S_2$ | $S_1$ | $S_2$ | |
| 4 | $S_3$ | $S_4$ | $S_3$ | $S_4$ | $S_3$ | $S_4$ | $S_3$ | $S_4$ | $S_3$ | $S_4$ | |
| 5 | $S_1$ | $S_2$ | $S_1$ | $S_2$ | $S_1$ | $S_2$ | $S_1$ | $S_2$ | $S_1$ | $S_2$ | |
| 6 | $S_3$ | $S_4$ | $S_3$ | $S_4$ | $S_3$ | $S_4$ | $S_3$ | $S_4$ | $S_3$ | $S_4$ | |
| 7 | $S_1$ | $S_2$ | $S_1$ | $S_2$ | $S_1$ | $S_2$ | $S_1$ | $S_2$ | $S_1$ | $S_2$ | |
| 8 | $S_3$ | $S_4$ | $S_3$ | $S_4$ | $S_3$ | $S_4$ | $S_3$ | $S_4$ | $S_3$ | $S_4$ | |
| 9 | $S_1$ | $S_2$ | $S_1$ | $S_2$ | $S_1$ | $S_2$ | $S_1$ | $S_2$ | $S_1$ | $S_2$ | |
| 10 | $S_3$ | $S_4$ | $S_3$ | $S_4$ | $S_3$ | $S_4$ | $S_3$ | $S_4$ | $S_3$ | $S_4$ | |
| 11 | $S_1$ | $S_2$ | $S_1$ | $S_2$ | $S_1$ | $S_2$ | $S_1$ | $S_2$ | $S_1$ | $S_2$ | |
| 12 | $S_3$ | $S_4$ | $S_3$ | $S_4$ | $S_3$ | $S_4$ | $S_3$ | $S_4$ | $S_3$ | $S_4$ | |

← ROW NO.

FIG. 6

PROGRAMMABLE LIGHT CONTROL MATRIX DEVICE

BACKGROUND OF THE INVENTION

The present invention generally concerns the control of light transmissions to generate desired light patterns and is specifically directed to a programmable matrix device which employs individually electrically energizable cells in a planar matrix array to effectuate such control.

There appears to be a substantial need for new and innovative programmable light control devices to control light transmissions for generating desired light patterns. A pregnant example of one application should help underscore this need.

As is well known, photographic masks are used to make image reproductions in quantity by generating permanent images on a photosensitive surface through the control of light which impinges thereon. Chemical reactions in the photosensitive coating of the surface produced by the light pattern striking it via the mask produces a permanent visual record of the light pattern. In the case of two-tone images, the mask contains in the form of artwork on a substrate of mylar or equivalent a combination of transparent and opaque areas for respectively completely passing and blocking light which defines the desired pattern. Because of the permanency of the artwork on the substrate, once the mask has served its purpose it cannot be reused for other patterns despite all of the time, effort and expense required to generate it in the first place.

There are numerous applications to which photographic masks are put. For example, in the manufacture of printed circuit boards one of the first steps is to either polymerize or degrade the polymerization, dependent upon whether a positive or negative process is used, of a photoresist material coated on the board which then permits the affected exposed areas of underlying copper substrate to be etched away thereafter. This step of polymerization is carried out by directing light, in particular ultra-violet rays, on the photoresist surface through a mask containing the desired pattern.

Because of the types of applications to which photographic masks are put, printed circuit boards being one example thereof, the art work used for producing the pattern of the mask requires a great degree of precision and accuracy to achieve a high degree of image resolution. Accordingly, these masks are normally produced through very sophisticated and expensive numerically controlled machines having a moving head which can be precisely positioned in the X-Y plane for directing light to generate the mask. The requisite machine movement not only adds to the production time for generating a photographic mask but also necessitates greater maintenance and repair periods which adds to the operating costs of the machine and detracts from its availability. In view of the large capital investment for these machines, the maintenance and repair downtimes represent an important factor in the manufacture of photographic masks. If the machine movement giving rise to the added maintenance and repair record could be eliminated, considerable savings would be realized. Although it may appear that the problem of reusable masks could be obviated by simply applying the machine controlled light directly to the photosensitive surface bearing the pattern reproduction, thereby eliminating the mask altogether, this is not a viable business alternative because of the large capitalized cost of the machine and its relatively slow operation, particularly in view of the large quantity of reproductions required.

With the foregoing example in mind, it is a primary object of the present invention to provide a new and innovative light control device, in the form of a planar matrix array of individually electrically energizable cells, which is programmable so that it can be reused as often as desired to generate different light patterns and entails no movement of components.

It is a further object of the present invention to provide such a programmable light control matrix device which may be easily fabricated and yet affords a high degree of image resolution.

These, as well as other objects and the means by which they are attained through the present invention, may be fully appreciated by referring to the Detailed Description of the Invention which follows hereinbelow together with the appended drawings.

BRIEF DESCRIPTION OF THE INVENTION

A programmable light control matrix device is provided through the use of a plurality of individually electrically energizable cells arranged in a planar matrix array for controlling the light transmitted therethrough. Each cell has two states, one for passing and the other for blocking light, one state occurring when the cell is energized and the other when it is deenergized. Each cell comprises a pair of parallel electrodes between which a film of electrooptic material, such as liquid crystal, having the foregoing characteristics is sandwiched and which is energized by an electric field whenever an electric potential is applied across its electrodes. Leads and terminals are provided for selectively energizing individual ones of the cells to develop the desired pattern.

In one embodiment of the invention, the planar matrix array is achieved through the use of two parallel transparent plates between which a thin sheet of electrooptic material is disposed, with transparent individual electrodes being borne on the inner surface of one of the plates and a common transparent electrode sheet being borne on the inner surface of the other plate for applying the energizing electric potential. Electrical leads to the individual electrodes extend to the outer surface of the plate via individual apertures which pass through the plate.

In alternative embodiments, the planar matrix array is achieved through the use of two or more subarrays having the same planar structure as the foregoing described array and arranged in adjoining planar juxtaposition with each subarray providing only a portion of the total number of cells so as to facilitate fabrication of the mask and/or enhance the image resolution achievable therewith. The individual cells of each subarray are arranged so that they do not overlap any cells of any other subarray; and in one embodiment displaying a further refinement the cells in one subarray are located so that their edges are in abutting alignment with the edges of cells in the other subarrays exclusively.

BRIEF DESCRIPTION OF THE DRAWINGS

FIG. 6 diagrams the use of four subarrays in a planar matrix array for achieving higher image resolutions by aligning in abutment fashion the edges of each cell in one subarray with the edges of cells in the other subarrays exclusively.

DETAILED DESCRIPTION OF THE INVENTION

Figure 1:
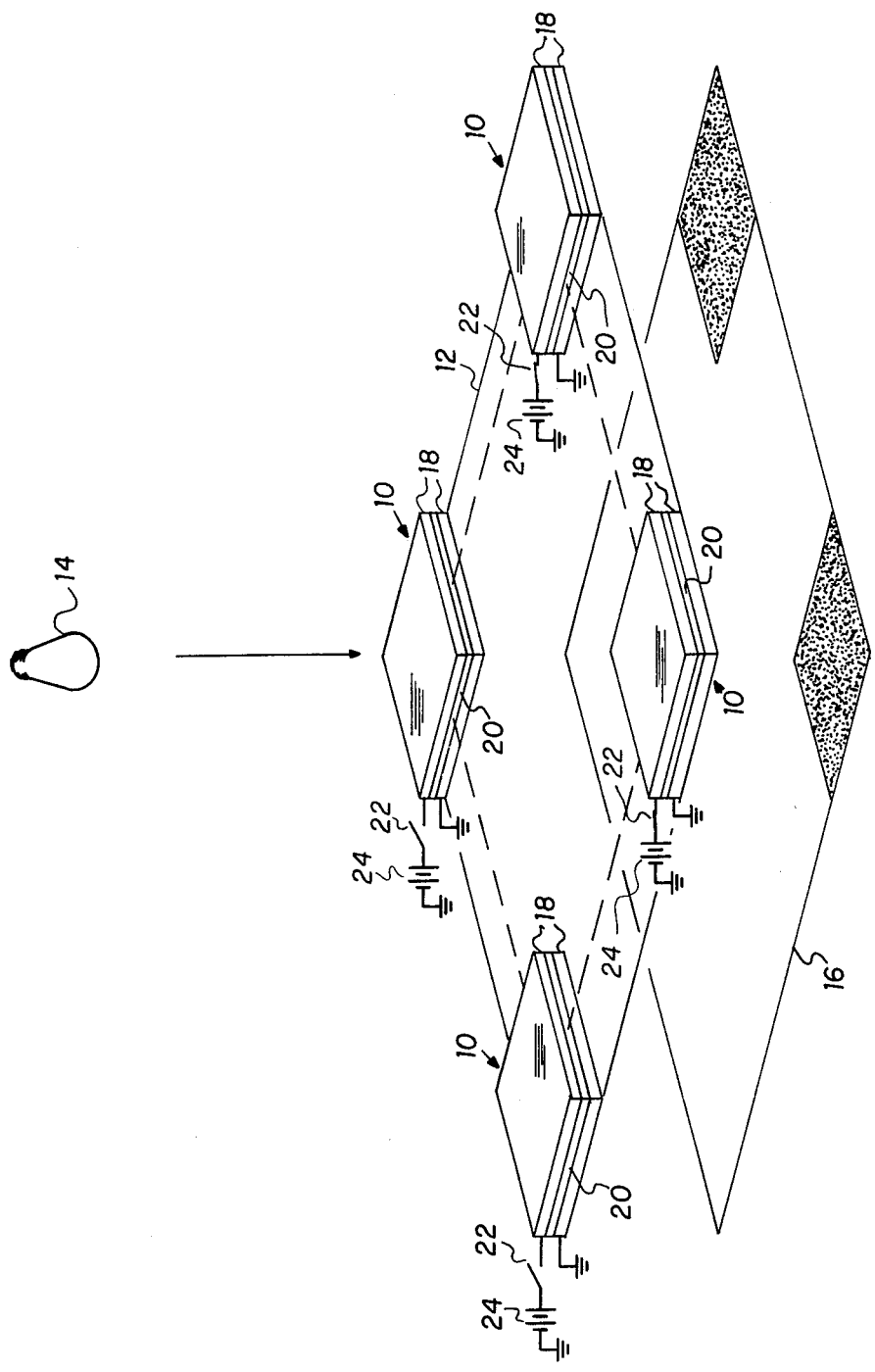
FIG. 1 is an isometric view depicting the invention.

As shown in FIG. 1, the programmable light control matrix device of the invention employs a plurality of cells 10 arranged in a planar matrix array, parallel to plane 12, which is positioned between a light source 14 and a photosensitive surface 16 for controlling the light which is transmitted therethrough to generate a desired pattern on the surface 16. Each cell 10 comprises a pair of parallel transparent electrodes 18 (shown solid only for pictorial clarity) between which is sandwiched a film of electrooptic material 20 having two states, one for blocking and the other for passing light, the state being determined by whether or not the material 20 is energized by an electric field produced across its respective electrodes 18. Ideally suited for performing the foregoing control function is liquid crystal material of the nematic type which may be designed to either block or pass light when energized, whichever is desired. For example, a cell of twisted nematic liquid crystal used in conjunction with polarizers (parallel polarizing planes on the exposed outer surfaces of electrodes 18) which are 90° out of alignment will block the passage of light when deenergized but transmit the light when energized. The reverse operation can be obtained (passage of light only when deenergized) by aligning the polarizing planes. Furthermore, nematic crystal material can be designed to discriminate against a selected frequency band in the light spectrum (such as the ultra-violet rays used in the etching process for fabricating printed circuit boards) by filtering out those frequencies when deenergized and permitting them to pass when energized simply by combination with non-ionic dichroic dyes in the guest-host mode. There is a great deal of knowledge on the subject of liquid crystal materials, particularly of the nematic type, and their various characteristics, so that if more detailed information is desired the reader is referred to the literature, including an article entitled "Liquid Crystal Displays" which appeared in the Nov. 19, 1972 issue of *IEEE Spectrum* and another article entitled "Liquid Crystal Matrix Displays" which appeared in the November 1971 issue of the *Proceedings of the IEEE*.

Each cell 10 is individually energizable by applying an electric potential across its respective electrodes 18 through the closure of a switch 22 which is connected between an individual electrode 18 of each cell 10 and a terminal of a battery 24. A current return path is provided by grounding the other terminal of the battery 24 and all the other electrodes 18 of the cell 10 in common. It is important to bear in mind that the switches 22 and batteries 24 are merely symbolic representations of the actual programming means for selectively energizing the cells 10 to generate the desired pattern. Although such a crude scheme would be feasible, it is obvious that to be practicable the planar matrix array requires a much more sophisticated, albeit easily designed, method of energizing the cells 10 which would entail driver circuitry for developing the proper magnitude of currents and voltages, compatible switching circuits for providing cell energization selectivity and timing circuits for controlling the energizing periods. The actual energizing scheme used in programming the matrix device will of course depend on the operating parameters chosen by the designer. Since the energizing scheme itself is not germane to the invention and further since numerous such schemes are well known to those skilled in the art, no details in respect thereof are required herein. Also, it should be noted that low frequency A.C. power is just as suitable for energizing the cells 10 as is D.C. power.

In the case of a photographic mask, the photosensitive surface 16 will comprise a chemical which reacts to light impinging thereon to produce a permanent image of the light pattern. If a negative process is used, then those areas where light strikes will appear dark (as in FIG. 1 assuming the energization of the two cells 10 on the right permits the light to pass therethrough) whereas in a positive process those areas exposed to light will appear light. Thus, by preventing light from passing through various areas of the planar matrix array of cells 10 and allowing it to pass through the other areas thereof any desired pattern can be generated on the photosensitive surface 16. The number of cells 10 and their cross sectional area incidental to the light and their spacing with respect to one another, will of course depend on the image resolution desired. The interstitial spacing must of course provide sufficient electrical insulation between adjacent cells 10 to avoid short circuiting between their respective electrodes 18. Furthermore, the arrangement of the cells 10 in the plane 12, shown in rectangular fashion herein only for illustrative purposes, may assume any array shape desired.

Figure 2:
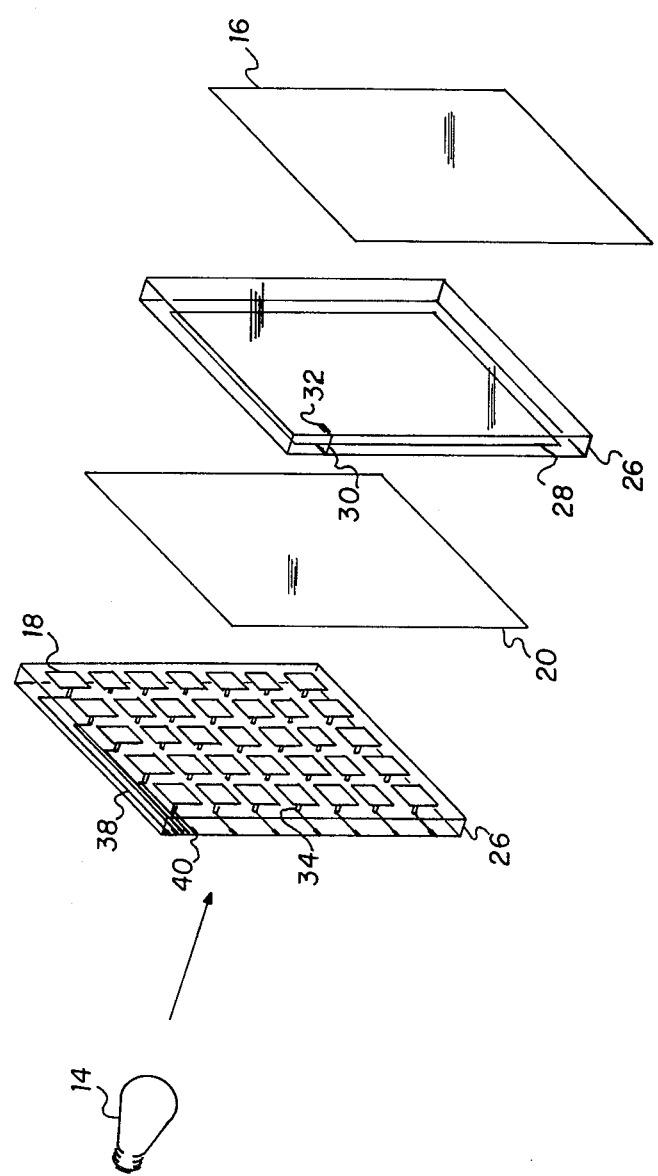
FIG. 2 is an isometric view of one embodiment of the invention which employs a single array (with the array components separated for the sake of pictorial clarity) and an individual electrode together with a common electrode for each of the cells.

FIG. 2 shows one embodiment of the invention wherein the planar matrix array of cells 10 is fabricated by disposing a thin sheet of electrooptic material 20 between two parallel transparent plates 26 of glass or equivalent substance on whose inner surfaces adjacent the sheet 20 (although not shown in contact in FIG. 2 only for pictorial clarity, it is to be understood that the components are in fact bonded together upon assembly) are deposited transparent conductors through any well known thin film technique which form the electrodes 18. The grounded common electrodes 18 of FIG. 1 are provided through a single continuous conductive sheet 28 on the inner surface of the right plate 26 while the other individual electrodes 18 of each of the cells 10 are borne on the inner surface of the left plate 26, with sufficient interstitial spacing between adjacent individual electrodes 18 for providing electrical insulation therebetween. The area occupied by each individual electrode 18 on the inner surface of the left plate 26 defines an individual cell 10, so that any cell 10 can be energized by applying an electrical potential across the conductive sheet 28 and its associated individual electrode 18. In this embodiment all cells selected for energization can be energized simultaneously.

While an electrical lead 30 to sheet 28 can be brought out on the inner surface of the right plate 28 and around its edge for connection to an external energizing source via a terminal 32 on the outer surface, the leads to the individual electrodes 18 on the inner surface of the left plate 26 cannot be likewise accommodated because of the great number of individual electrodes 18 contained on the surface and the extremely small interstitial spacing provided therebetween. For example, the interstitial spacing might be of the order of 1 mil with an electrode 18 side dimension of 10 mils; the 1 mil spacing provides sufficient separation between adjacent electrodes 18 to afford electrical insulation therebetween, yet is small enough for most applications so as not to produce significant adverse effects in the pattern reproduction because of the lack of light control in these regions. To overcome the lead deployment problem in this embodiment, the leads are brought out through the plate 26 itself to its outer surface via the walls of apertures 34, there being an individual aperture 34 for each electrode 18. The metallic coating on the walls of the apertures 34 provides sufficient metal for passing the requisite current to the individual electrodes 18 while avoiding transparency problems which might otherwise interfere with light transmissions through the plate 26 if wire leads, even thin ones, were to be used.

Figure 3:
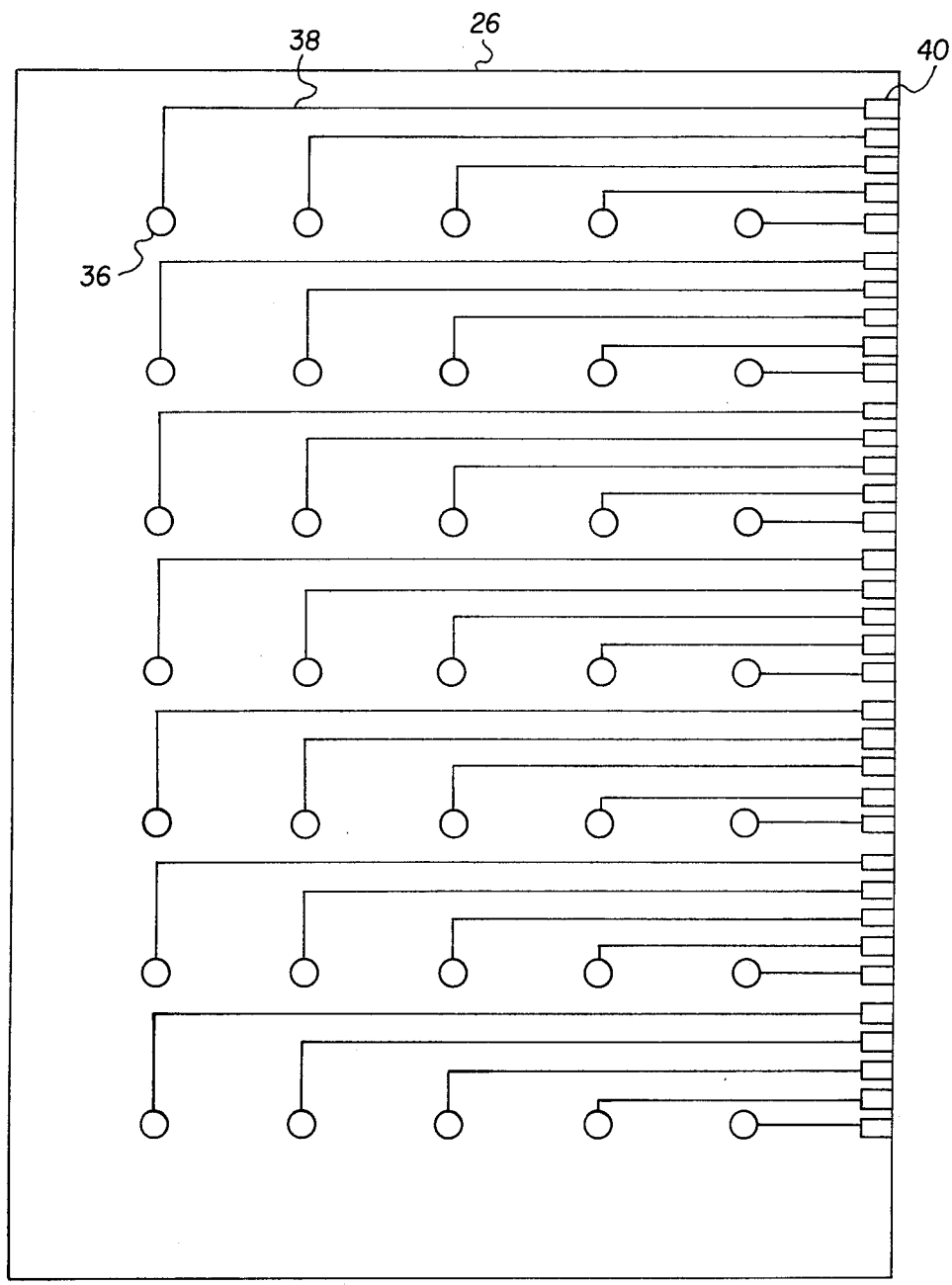
FIG. 3 is an end view of the planar matrix array of FIG. 2 illustrating how the electrical leads from the individual electrodes are deployed to individual terminals for connection to the external energizing source.

As shown in FIG. 3, which is an end view of the planar matrix array of FIG. 2 looking at the outer surface of the left plate 26, the metallic coatings on the walls of the apertures 34 terminate in small metallic rims 36 around the aperture peripheries to which are connected leads 38 which are then brought out to individual terminals 40 along a side edge of the plate 26. Each terminal 40 provides individual access to a single individual electrode 18 of the cell 10 so that a cell 10 is energized by applying a potential across its associated terminal 40 and terminal 32. The assembly of the planar matrix array of FIG. 2, as well as those to be described hereinafter, is such that it can be easily plugged into a connector just like a printed circuit board for connecting terminals 40 and 32 to an external energizing source.

Figure 4:
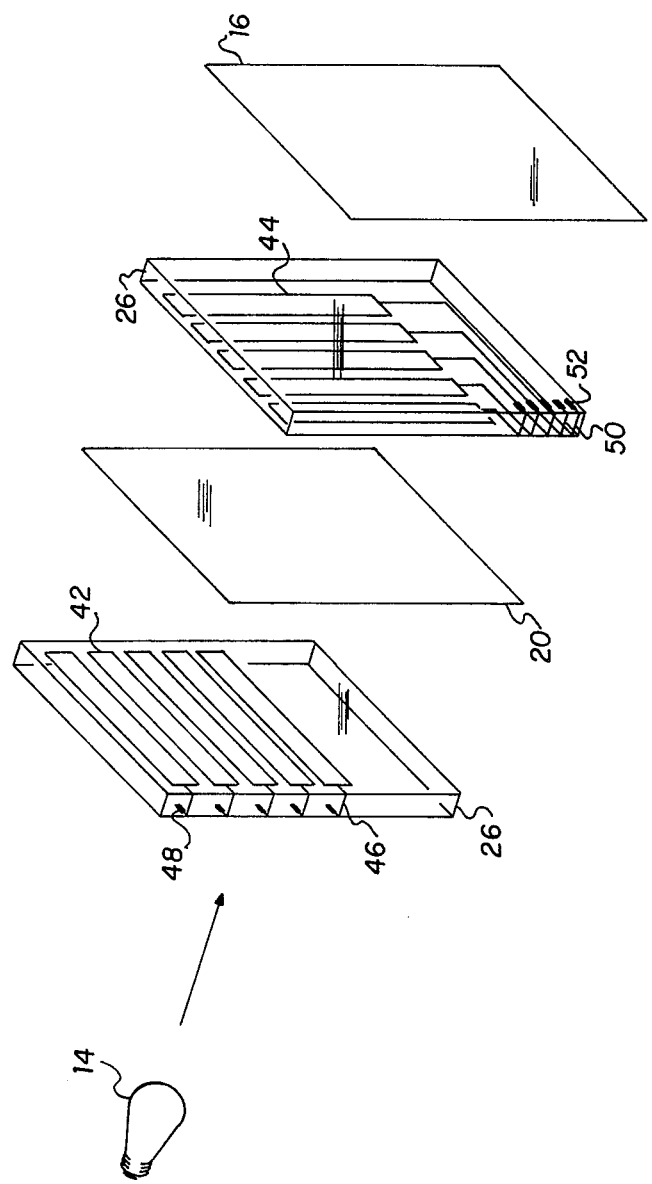
FIG. 4 is an isometric view of another embodiment of the invention employing a single array and electrodes which are defined by intersecting rows and columns of conductive strips.

An alternative embodiment of the invention which affords a more simplified fabrication than the foregoing is shown in FIG. 4. In this embodiment, one electrode 18 of each cell 10 is provided through a series of rows of conductive strips 42 on the inner surface of one transparent plate 26 while the other electrode 18 of each cell 10 is provided through a series of columns of conductive strips 44 on the inner surface of the other plate 26. The overlapping area of an intersecting row 42 and column 44 defines a cell 10, so that a cell is energized by applying an electric potential across the row 42 and column 44 corresponding thereto. This embodiment of the invention results in slower production times than the foregoing embodiment of FIG. 2, since all the cells selected for energization cannot be energized simultaneously. Selectivity is achieved in this embodiment by sequentially energizing rows 42 (for columns 44) and simultaneously energizing with each energized row 42 (or columns 44) the columns 44 (or rows 42) corresponding to the selected cells 10. The slower production time is somewhat compensated for by the simplified fabrication afforded through the use of conductive strips 42 and 44 rather than individual electrodes 18. In addition to simplifying the thin film processing necessary to generate the cells 10, this embodiment permits a more facile arrangement for deploying leads. None of the leads in this array need be brought out via apertures in the plate 26. The strips constituting the rows 42 can be terminated in leads 46 which extend around the edge of plate 26 to its outer surface where they connect with individual terminals 48 along the side edge. The strips constituting the columns 44 can be terminated in leads 50 which are brought out to a side edge of plate 26 along its inner surface and then brought around its edge to its outer surface to connect with terminals 52 along the edge. It is to be noted that the area occupied by the column leads 50 is at the bottom of inner surface of plate 26 and is not coextensive with any conductors on the inner surface of the other plate 26 bearing the rows 42. Consequently, the electrical energization of these leads 52 cannot produce an electric field in the sheet 20 which might otherwise create unwanted light pattern effects.

Figure 5:
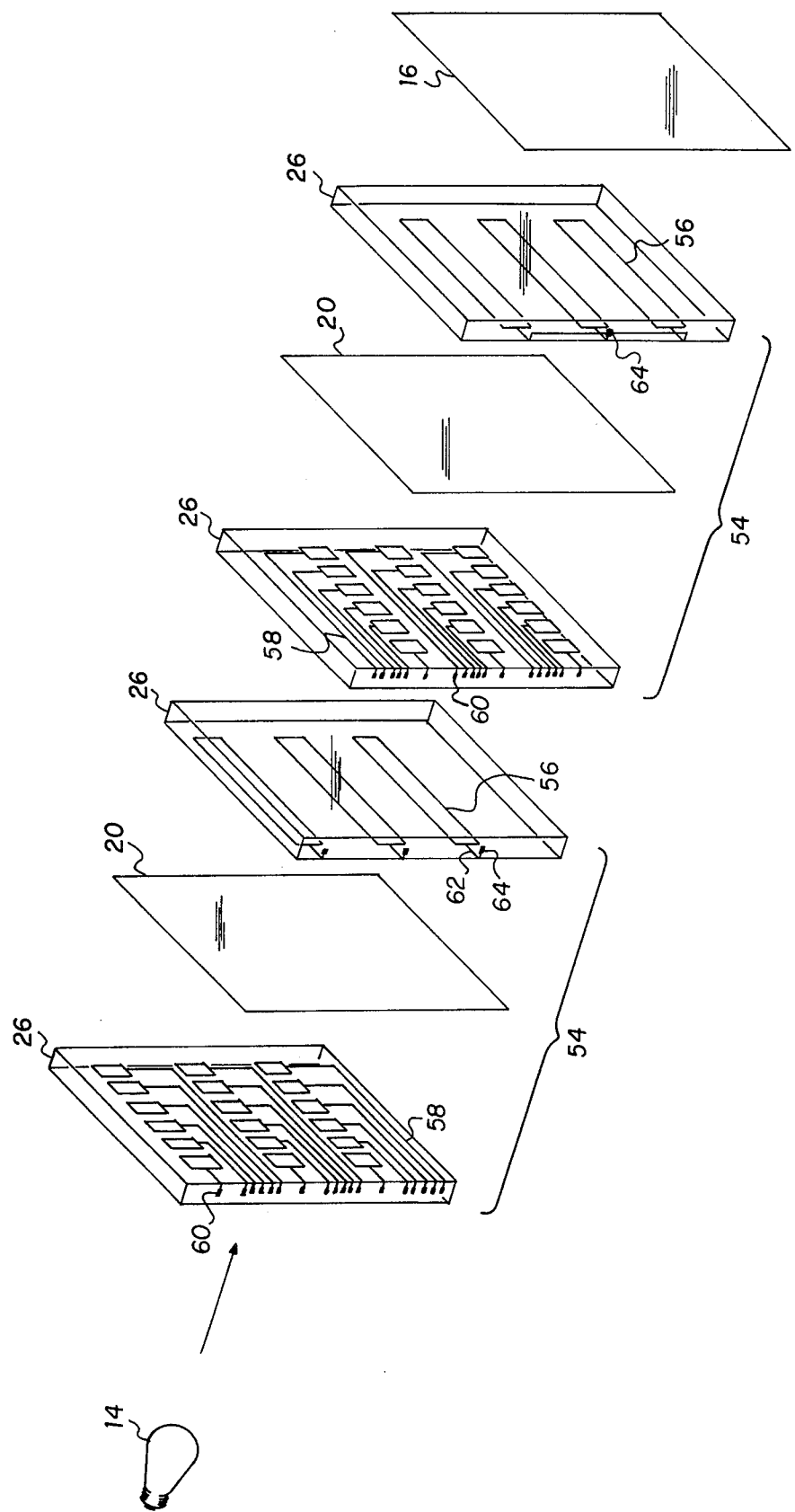
FIG. 5 is an isometric view of still another embodiment of the invention employing a planar array which is fabricated with two subarrays and electrode pairs defined by an individual electrode and a conductive strip for each cell.

A third embodiment of the invention is depicted in FIG. 5 which provides a simpler fabrication than the first described embodiment with respect to lead deployment, yet permits the same speed of operation by allowing the individual cells 10 selected for energization to be energized simultaneously. This array which has rows and columns of cells 10 is formed with two subarrays 54, each comprising a pair of transparent plates 26 and a thin sheet of material 20 therebetween as in the foregoing embodiment. Each subarray 54 contains on the inner surface of one of its plates 26 alternate rows of individual electrodes 18 while its other plate 26 contains on its inner surface rows of conductive strips 56 which are coincident with the aforementioned alternate rows of individual electrodes 18. A cell 10 is energized by applying an electrical potential across the row 56 and individual electrode 18 in the same subarray 54 corresponding thereto. The leads 58 from the individual electrodes 18 are brought out to the side edges of the plates 26 along their inner surfaces between the alternate rows of electrodes 18. These leads 58 are connected to terminals 60 on the side edges of the associated plate 26. The leads 62 from the rows of strips 56 on the inner surface of each plate 26 connected to a common terminal 64 on the side edge of the associated plate 26. When the assembly is inserted in a connector, the terminals 60 and 64 contact other terminals leading to the equipment energizing source.

It will be readily seen that when the two subarrays 54 are placed in aligning planar juxtaposition abutting one another upon assembly, the alternate rows of cells 10 defined by alternate rows of individual electrodes 18 and associated strips 56 in one subarray 54 interleave the alternate rows of cells 10 in the other subarray 54, thereby providing complete light control coverage throughout the array. Thus, the left subarray 54 provides the cells 10 for the odd rows of cells in the array, assuming row counting for the array begins at the top, while the right subarray 54 provides the cells 10 for the even rows of cells in the array. It will be further observed that since the leads 58 to the individual electrodes 18 of each subarray 54 do not coincide with any conductors on the inner surface of the other plate 26 of its respective subarray 54 and since the thickness of each plate 26 is sufficient to insulate the inner and outer plate surfaces from one another, the energization of the leads 58 can produce no adverse light control effects. Since it will be readily seen that for effective light control by the right subarray 54 which is away from the light source 14, light must pass unimpaired through the areas between rows of cells 10 in the closer left subarray 54, the sheet of material 20 used in this embodiment must be of the type that passes light when deenergized.

The twisted nematic type of liquid crystal material in conjunction with aligned polarizing planes (on either the inner or outer surfaces of the plates 26) is suitable for this application.

All of the foregoing embodiments of the invention assume that the interstitial insulating areas between adjacent electrodes 18 are of no consequence in effectuating light control. Should this present problems in the level of image resolution desired, the problem can be overcome through the use of four subarrays 54 arranged in aligning planar juxtaposition as the two shown in FIG. 5. In this case, however, each subarray 54 would contain an individual electrode 18 in alternate column positions along each of its rows. When assembled none of the cells 10 in one subarray 54 would overlap the cells 10 in any other subarray 54. Thus, one subarray 54 would have individual electrodes 18 defining cells 10 in the odd columns of odd rows of the entire array, while a second subarray 54 would contain electrodes 18 defining cells 10 in the even columns of the odd rows of the array. Similarly, a third subarray 54 would contain electrodes 18 in the odd columns of even rows of the array while the fourth and last subarray 54 would contain electrodes 18 in the even columns of even rows of the array. This is pictorially represented in FIG. 6 which is an end perpendicular view of the array with the numbers on the left and on top identifying the rows and columns of the array respectively and each box representing an individual electrode 18 which defines a cell 10 with the S subscript in the box identifying the subarray to which it belongs. All cells 10 represented by the boxes adjoin other cells so that there are not interstitial areas for preventing effective total light control once the four subarrays 54 are placed in aligning planar juxtaposition upon assembly as shown. Yet, because the edges of each cell in one subarray 54 are in abutting alignment only with the edges of cells in the other subarrays exclusively, no individual electrode 18 of a given subarray 54 short circuits another electrode 18 of that subarray 54 thereby permitting individual simultaneous energization of the selected cells 10. As with the embodiment of FIG. 5 the companion electrodes for the individual electrodes 18 are provided through rows of conductive strips 56 coincident with the rows of individual electrodes 18 of each subarray 54 connected to individual terminals 60 via leads 58. Since this embodiment also comprises subarrays, the sheet of material 20 used must be of the type that passes light when deenergized. It will be readily appreciated that other subarray configurations, including one with three subarrays and hexagonal-shaped electrodes 18 are equally efficacious as the one just described for performing its intended function.

The invention herein thus provides a programmable light control matrix device for effectuating light control to generate desired light patterns without resort to moving parts and with the significant benefit that it can be reused as many times as desired to generate different patterns without material waste. Furthermore, the planar matrix array of cells comprising the invention can be fabricated in different ways as desired to achieve different design goals using well known manufacturing techniques. Thus, the cost of assembly can be minimized while still retaining the operating benefits.

Since various modifications to the foregoing embodiments of the invention may be accomplished by those skilled in the art without departing from the scope and spirit of the invention, the foregoing Detailed Description is intended to be merely exemplary and not restrictive of the invention as will now be claimed hereinbelow.

What is claimed is:

1. A programmable light control matrix device comprising a planar surface matrix array of cells, each cell being formed with a pair of transparent parallel electrodes separated by a film of electrooptic material having two states, one for passing and the other for blocking light, one state occurring when said cell is electrically energized and the other when it is deenergized wherein said array is formed with a pair of transparent parallel plates having inner and outer surfaces and said material is a continuous sheet disposed therebetween, one of said plates bearing on its inner surface adjacent said sheet a continuous conductive sheet constituting a common electrode of each of said cells and the other plate bearing on its inner surface adjacent said film a plurality of individual electrodes, each constituting the other electrode of said cells and being associated with an individual one thereof, whereby a cell is energized by applying an electric potential across its associated individual electrode and said conductive sheet, and said other plate has individual apertures passing between its inner and outer surfaces, there being one for each of said individual electrodes collinear with its associated electrode, having thin metallized walls which do not obstruct the passage of light so that it may pass therethrough from one of said plates to the other and that function as leads which connect to said individual electrodes for applying an electric potential thereto.

2. The matrix device of claim 1 wherein said material is of the type that blocks the passage of light when energized.

3. The matrix device of claim 2 wherein said material is liquid crystal of the twisted nematic type and includes aligned polarizing planes.

4. The matrix device of claim 1 in combination with a light source and a photosensitive surface located on opposite sides of said array.

5. The matrix device of claim 1 wherein said material passes light when energized and blocks a selected frequency band when deenergized.

6. The matrix device of claim 5 wherein said material is a combination of nematic liquid crystal and a non-ionic dichroic dye.

7. A programmable light control matrix device comprising a planar surface matrix array of cells, each cell being formed with a pair of transparent parallel electrodes separated by a film of electrooptic material having two states, one for passing light when deenergized and the other for blocking light when energized, wherein said array contains rows of cells and is formed with two planar surface subarrays in adjoining planar juxtaposition which are simultaneously energizable, each of said subarrays being formed with a pair of transparent parallel plates having inner and outer surfaces, and said material is a continuous sheet disposed therebetween, with one of the plates of each subarray bearing on its inner surface adjacent its associated sheet alternate rows, with respect to the rows of the array, of a plurality of individual electrodes, each constituting one of the electrodes for the cells of its associated subarray and the other plate of each subarray bearing on its inner surface adjacent its associated sheet conductive strips coincident with said alternate rows constituting the other electrode of each of the associated cells so that a cell is energized by applying an electric potential across the conductor strip and individual electrode corresponding thereto, said array being arranged so that the alternate rows of individual electrodes of one subarray interleave the alternate rows of individual electrodes of the other subarray and including conductive leads to said individual electrodes which are borne on the inner surface of the associated plate in the spaces between said alternate rows.

8. The matrix device of claim 7 in combination with a light source and a photosensitive surface located on opposite sides of said array.

9. A programmable light control matrix device comprising a planar surface matrix array of cells, each cell being formed with a pair of transparent parallel electrodes separated by a film of electrooptic material having two states, one for passing light when deenergized and the other for blocking light when energized, wherein said array is formed with a plurality of planar surface subarrays in adjoining planar juxtaposition which are simultaneously energizable, each of said subarrays being formed with a pair of transparent parallel plates having inner and outer surfaces and said material is a continuous sheet disposed therebetween, with the plates of each subarray bearing on their inner surfaces adjacent said continuous sheet a plurality of paired electrodes defining individual cells of said array arranged so that none of the cells in one subarray overlap the cells in any other subarray.

10. The matrix device of claim 9 wherein the edges of each cell in one subarray are in abutting alignment with the edges of cells in the other subarrays exclusively as viewed perpendicularly from an end of the array.

11. A programmable light control matrix device comprising a planar surface matrix array of cells, each cell being formed with a pair of transparent parallel electrodes separated by a film of electrooptic material having two states, one for passing light when deenergized and the other for blocking light when energized, wherein said array has adjoining rows and columns of cells and is formed with four planar surface subarrays in adjoining planar juxtaposition which are simultaneously energizable, each of said subarrays being formed with a pair of transparent parallel plates having inner and outer surfaces and said material is a continuous sheet disposed therebetween, with one of the plates of each subarray bearing on its inner surface adjacent its associated sheet alternate rows, with respect to the rows of the array, of a plurality of individual electrodes in alternate columns, with respect to the columns of the array, each individual electrode constituting one of the electrodes for the cells associated with its subarray and including conductive leads to said individual electrodes which are borne on the inner surface of the associated plate in the spaces between said alternate rows and the other plate of each subarray bears on its inner surface adjacent its associated film conductive strips coincident with said alternate rows constituting the other electrodes of each of the associated cells, so that a cell is energized by applying an electric potential across the conductive strip and the individual electrode corresponding thereto, said array being arranged so that none of the cells in one subarray overlap the cells in any other subarray.

12. The matrix device of claim 11 in combination with a light source and a photosensitive surface located on opposite sides of said array.

* * * * *

UNITED STATES PATENT OFFICE
CERTIFICATE OF CORRECTION

PATENT NO. : 4,050,814
DATED : September 27, 1977
INVENTOR(S) : Thomas A. McFadden It is certified that error appears in the above-identified patent and that said Letters Patent are hereby corrected as shown below:

Column 1, line 56, delete "adds" and insert therefor --add--.
Column 3, line 46, after "nematic" insert --liquid--.
Column 5, line 2, delete "28" and insert therefor --26--.
Column 6, line 10, before "inner" insert --the--.
Column 7, line 33, delete "not" and insert therefor --no--.
Column 8, line 26, after "electrodes" delete "collinear" and insert therefor --co-linear--.

Signed and Sealed this

Thirtieth Day of May 1978

[SEAL]

Attest:

RUTH C. MASON
Attesting Officer

LUTRELLE F. PARKER
Acting Commissioner of Patents and Trademarks